US012690301B2

(12) United States Patent
Cheng

(10) Patent No.: US 12,690,301 B2
(45) Date of Patent: Jul. 21, 2026

(54) DIODE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 555 days.

(21) Appl. No.: 18/177,036

(22) Filed: Mar. 1, 2023

(65) Prior Publication Data

US 2023/0207737 A1      Jun. 29, 2023

Related U.S. Application Data

(63) Continuation of application No. PCT/CN2020/128093, filed on Nov. 11, 2020.

(51) Int. Cl.
| | |
|---|---|
| *H10H 20/831* | (2025.01) |
| *H10H 20/00* | (2025.01) |
| *H10H 20/01* | (2025.01) |
| *H10H 20/815* | (2025.01) |
| *H10H 20/825* | (2025.01) |

(52) U.S. Cl.
CPC ........ *H10H 20/8312* (2025.01); *H10H 20/01* (2025.01); *H10H 20/052* (2025.01); *H10H 20/815* (2025.01); *H10H 20/825* (2025.01); *H10H 20/032* (2025.01)

(58) Field of Classification Search
CPC .. H10H 20/8312; H10H 20/01; H10H 20/052;

H10H 20/815; H10H 20/825; H10H 20/032; H10H 20/00–882; H10H 29/00–142; H10D 8/043; H10D 8/051; H10D 8/50; H10D 8/60; H10D 8/00–825;

(Continued)

(56) References Cited

U.S. PATENT DOCUMENTS

| | | | |
|---|---|---|---|
| 11,011,674 B2 * | 5/2021 | Bi | ........................ H10H 20/816 |
| 2004/0026703 A1 | 2/2004 | Adomi et al. | |

(Continued)

FOREIGN PATENT DOCUMENTS

| | | |
|---|---|---|
| CN | 102119449 A | 7/2011 |
| CN | 102446980 A | 5/2012 |

(Continued)

OTHER PUBLICATIONS

International Search Report issued in corresponding PCT Application No. PCT/CN2020/128093, dated Jul. 26, 2021.

(Continued)

*Primary Examiner* — Shahed Ahmed
(74) *Attorney, Agent, or Firm* — Westbridge IP LLC

(57) ABSTRACT

Disclosed are a diode and a manufacturing method thereof. The diode includes: a first substrate, the first substrate being an N-type doped substrate with a doping concentration equal to or greater than $1 \times 10^{18}$ cm$^{-3}$; a metal atomic layer located on a first surface of the first substrate; an epitaxial structure located on the metal atomic layer; a first electrode located on the epitaxial structure; and a second electrode located on a second surface, opposite to the first surface, of the first substrate. The diode significantly reduces forward conduction voltage drop.

19 Claims, 6 Drawing Sheets

1 A 140
120
110
100
150

(58) Field of Classification Search
CPC ................ H10D 84/204; H10D 84/221; C23C
16/45525–45555
See application file for complete search history.

(56) References Cited

U.S. PATENT DOCUMENTS

| 2004/0135158 | A1 | 7/2004 | Hon | |
| 2007/0241350 | A1 | 10/2007 | Kim | |
| 2009/0309126 | A1* | 12/2009 | Okuno | ................. H10H 20/815 |
| | | | | 438/46 |
| 2011/0031472 | A1 | 2/2011 | Tang et al. | |
| 2025/0169246 | A1* | 5/2025 | Wang | ................. H10H 20/825 |

FOREIGN PATENT DOCUMENTS

| CN | 103346083 | A | 10/2013 |
| CN | 107482091 | A | 12/2017 |
| CN | 109004018 | A | 12/2018 |
| CN | 109841714 | A | 6/2019 |
| CN | 111261725 | A | 6/2020 |
| JP | H10229217 | A | 8/1998 |
| JP | 2005330132 | A | 12/2005 |
| TW | 201444046 | A | 11/2014 |
| WO | 2018068301 | A1 | 4/2018 |

OTHER PUBLICATIONS

Written Opinion issued in corresponding PCT Application No. PCT/CN2020/128093, dated Jul. 26, 2021.

* cited by examiner

1 A

1 B

100

110

100

120

110

100

140

120

110

100

140

120

110

100

150

DIODE AND MANUFACTURING METHOD THEREOF

CROSS-REFERENCE TO RELATED APPLICATIONS

This application is a continuation of International Application No. PCT/CN2020/128093, filed on Nov. 11, 2020, the disclosure of which is hereby incorporated by reference in its entirety.

TECHNICAL FIELD

The present application relates to the field of semiconductor device technologies, and in particular, to a diode and a manufacturing method thereof.

BACKGROUND

In general, for power devices, a larger current can flow through a vertical structure Schottky diode than a lateral structure Schottky diode, and therefore, the vertical structure Schottky diode is more suitable for the power devices. A power device using an insulating substrate, such as a sapphire substrate, cannot provide the vertical structure Schottky diode. Usually, a conductive substrate is used to realize such vertical structure Schottky diode. However, in the existing technology, due to a certain voltage drop between a semiconductor layer and the conductive substrate, a forward voltage drop of a corresponding vertical structure Schottky diode is relatively high. In addition, for a PN-junction diode, there is also a problem that a forward voltage drop of the PN-junction diode is relatively high due to the certain voltage drop between the semiconductor layer and the substrate. Furthermore, there are various problems in a stripping process, which seriously affect a preparation cost and yield of light-emitting diodes. For example, a laser stripping method (mainly used for the sapphire substrate) has a high cost; and a chemical etching stripping method (mainly used for a silicon substrate) may lead to poor efficiency and yield, and the stripped substrate cannot be reused. Therefore, there is an urgent need for a diode that may significantly reduce a forward conduction voltage drop of an entire device.

SUMMARY

In view of this, purposes of the present application are to provide a diode and a manufacturing method thereof.

The technical solutions adopted by embodiments of the present application are as follows.

In a first aspect, a diode provided by the embodiments of the present application may include:

a first substrate, the first substrate being an N-type doped substrate with a doping concentration equal to or greater than $1 \times 10^{18}$ cm$^{-3}$;

a metal atomic layer located on a first surface of the first substrate;

an epitaxial structure located on the metal atomic layer;

a first electrode located on the epitaxial structure; and a second electrode located on a second surface, opposite to the first surface, of the first substrate.

Optionally, the epitaxial structure includes: an N-type semiconductor layer; an intrinsic semiconductor layer located on the N-type semiconductor layer; and a P-type semiconductor layer located on the intrinsic semiconductor layer.

Optionally, a doping concentration of the N-type semiconductor layer is equal to or greater than $1 \times 10^{18}$ cm$^{-3}$.

Optionally, the epitaxial structure includes: an N-type semiconductor layer including a groove; and a P-type semiconductor layer located in the groove.

Optionally, the N-type semiconductor layer is a lightly doped semiconductor layer, the P-type semiconductor layer is a heavily doped semiconductor layer, and the N-type semiconductor layer and the P-type semiconductor layer have a single-layer structure or a multi-layer structure.

Optionally, the first substrate has at least one pattern.

Optionally, the metal atomic layer has a pattern, and the pattern is a continuous pattern or a discontinuous pattern.

Optionally, a material of the metal atomic layer is one of Al and Mg.

Optionally, the first electrode is in Schottky contact with the epitaxial structure, and the second electrode is in ohmic contact with the first substrate.

Optionally, a nucleation layer or a buffer layer is located between the metal atomic layer and the epitaxial structure.

Optionally, the diode further includes a second substrate located between the first substrate and the second electrode, the second substrate is an N-type doped substrate with a doping concentration less than $1 \times 10^{18}$ cm$^{-3}$, and the second electrode is in ohmic contact with the second substrate.

Optionally, the N-type semiconductor layer and the P-type semiconductor layer are semiconductor layers made of one or more materials of GaN, AlN, AlGaN, InGaN, InN, InAlGaN and AlInN.

Optionally, the first electrode and the second electrode are both single-layer metal or multi-layer mixed metal. Optionally, the diode further includes a passivation layer located on the epitaxial structure, and the passivation layer is formed by one or a combination of aluminum nitride, silicon dioxide, silicon oxynitride and aluminum oxide.

Optionally, the diode is a vertical structure light emitting diode, and a horizontal width of the vertical structure light emitting diode is less than 500 um.

Optionally, a horizontal width of the vertical structure light emitting diode is less than 100 um.

BRIEF DESCRIPTION OF THE DRAWINGS

In order to more clearly explain embodiments of the present application or the technical solutions in the existing technology, the following may briefly introduce the accompanying drawings needed to be used in the embodiments. It is obvious that the accompanying drawings in the following description are only some embodiments of the present application. For the person of ordinary skill in the art, other accompanying drawings may also be obtained according to these accompanying drawings without creative work. The above and other purposes, features and advantages of the present application may be clearer through the accompanying drawings. The same reference numerals in all accompanying drawings indicate the same parts. The accompanying drawings are not intentionally scaled according to an actual size, and a key point is to show the main ideas of the present application.

DETAILED DESCRIPTION OF THE EMBODIMENTS

The following may give a clear and complete description of the technical solutions in the embodiments of the present application in combination with the accompanying drawings in the embodiments of the present application. Obviously, the described embodiments are only part of the embodiments of the present application, not all of them. Based on the embodiments in the present application, all other embodiments obtained by the person of ordinary skill in the art without creative work fall within the protection scope of the present application.

It should be noted that similar numerals and letters represent similar items in the following drawings. Therefore, once an item is defined in a drawing, it is not necessary to further define and explain the item in the subsequent drawings. At the same time, in the description of the present application, the terms "first", "second" and the like are only used to distinguish descriptions, and cannot be understood as indicating or implying relative importance. In the description of the embodiments of the present application, it may be understood that when a layer (or a film), a region, a pattern or a structure is said to be "on" or "under" another substrate, another layer (or another film), another region, another pad or another pattern, it can be "directly" or "indirectly" on another substrate, another layer (or another film), another region, another pad or another pattern, or there may also be one or more intermediate layers. A position of a layer has been described with reference to the accompanying drawings. For convenience or clarity, a thickness and a size of each layer shown in the accompanying drawings may be enlarged, omitted or schematically drawn. In addition, a size of a component shown in the accompanying drawings does not fully reflect an actual size.

Figure 1:
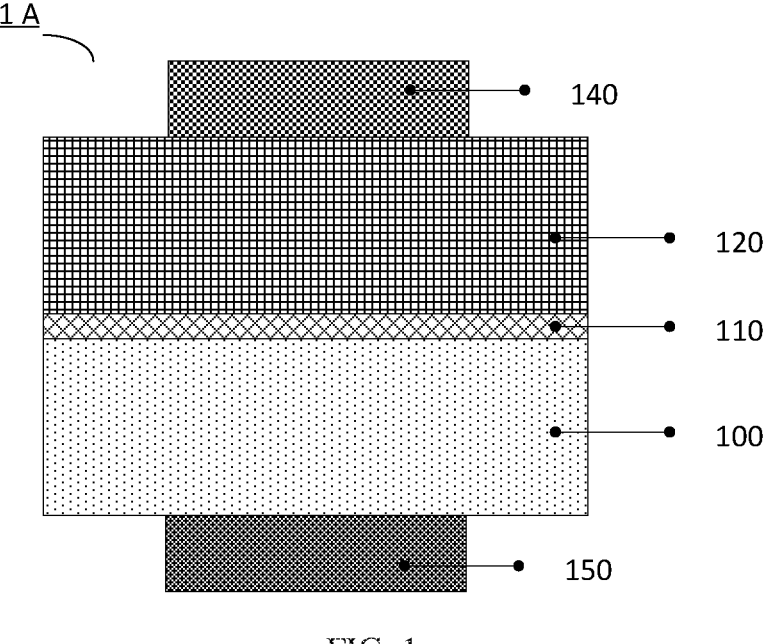
FIG. 1 is a schematic sectional view of a diode according to an embodiment of the present application.

Referring to FIG. 1, a diode 1A provided by an embodiment of the present application may include: a first substrate 100, which is an N-type doped substrate with a doping concentration equal to or greater than $1 \times 10^{18}$ cm$^{-3}$; a metal atomic layer 110 located on a first surface of the first substrate 100; an epitaxial structure 120 located on the metal atomic layer 110; a first electrode 140 located on the epitaxial structure 120; and a second electrode 150 located on a second surface, opposite to the first surface, of the first substrate 100. The second electrode 150 is in ohmic contact with the first substrate 100.

The first substrate 100 may be a GaN substrate, a Si substrate, a silicon carbide substrate or other suitable non-insulating substrate, and preferably may be the Si substrate. N-type doping elements in the first substrate 100 may be selected from any one or more of silicon, germanium, tin, selenium and tellurium.

The epitaxial structure 120 may be formed by stacking an N-type semiconductor layer, an intrinsic semiconductor layer and a P-type semiconductor layer, that is, a Positive-Intrinsic Negative (PIN) structure is formed. The epitaxial structure 120 may also be formed by an N-type semiconductor layer including a groove and a P-type semiconductor layer located in the groove, that is, a Junction Barrier Schottky (JBS) structure is formed. A doping concentration of the N-type semiconductor layer is equal to or greater than $1 \times 10^{18}$ cm$^{-3}$. The N-type semiconductor layer and P-type semiconductor layer may be semiconductor layers made of a material selected from GaN, AlN, AlGaN, InGaN, InN, InAlGaN, AlInN, AlGaAs, GaP, GaAs, GaAsP and AlGaInP. N-type doping elements in an N-type semiconductor structure may be selected from any one or more of silicon, germanium, tin, selenium and tellurium. It should be noted that the N-type semiconductor layer and the P-type semiconductor layer themselves may have two or more layers, but it is necessary to ensure that the doping concentration of N-type doping of one layer, in contact with the first substrate 100 is greater than $1 \times 10^{18}$ cm$^{-3}$, in the two or more layers of the N-type semiconductor layer.

In a specific embodiment, the first electrode 140 may be single-layer metal or multi-layer mixed metal. Similarly, the second electrode 150 may also be single-layer metal or multi-layer mixed metal. Specifically, the first electrode 140 may be composed of one or a combination of gold (Au), nickel (Ni), titanium (Ti), chromium (Cr), palladium (Pd), cobalt (Co), nickel chromate (NiCr), germanium (Ge), platinum (Pt), copper (Cu), silver (Ag) and tungsten (W).

In the diode 1A provided by an embodiment of the present application, since the first substrate 100 has a high concentration of N-type doping and the metal atomic layer 110 is made on the first substrate 100, a potential barrier between the epitaxial structure 120 and the first substrate 100 may be reduced, so that electrons may pass through the potential barrier between the first substrate 100, the metal atomic layer 110 and the epitaxial structure 120 when the diode is conducted in a forward direction. Therefore, a forward conduction voltage drop of the diode may be significantly reduced. In addition, by setting the metal atomic layer 110 between a substrate and an epitaxial layer, there is no need to perform stripping process after the epitaxial layer is formed, which reduces damage to the device and omits preparation steps, effectively saves a preparation cost of the diode and improves a preparation efficiency.

Figure 2:
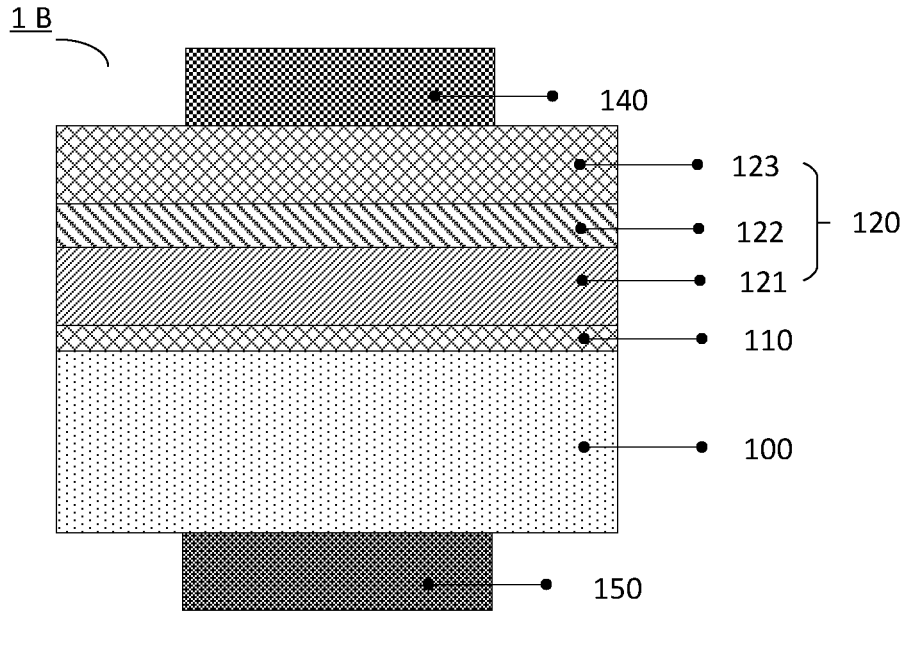
FIG. 2 is a schematic sectional view of a diode according to another embodiment of the present application.

As shown in FIG. 2, a schematic sectional view of a diode 1B according to another embodiment of the present application is shown. The difference between the embodiment shown in FIG. 2 and the embodiment shown in FIG. 1 is mainly that the epitaxial structure 120 in the diode 1B shown in FIG. 2 includes an N-type semiconductor layer 121, an intrinsic semiconductor layer 122, and a P-type semiconductor layer 123 which are stacked, that is, a PIN structure is formed. The intrinsic semiconductor layer 122 is located between the N-type semiconductor layer 121 and the P-type semiconductor layer 123. The first electrode 140 is located on the P-type semiconductor layer 123, and the first electrode 140 is in ohmic contact with the P-type semiconductor layer 123. For the rest parts of the diode 1B shown in FIG. 2, reference may be made to the corresponding parts of the diode 1A shown in FIG. 1, and the details are not repeated here.

The N-type semiconductor layer 121, the intrinsic semiconductor layer 122, and the P-type semiconductor layer 123 may all be a semiconductor layer made of one or more materials selected from GaN, AlN, AlGaN, InGaN, InN, InAlGaN, AlInN, AlGaAs, GaP, GaAs, GaAsP and AlGaInP. N-type doping elements in the N-type semiconductor layer 121 may be selected from any one or more of silicon, germanium, tin, selenium and tellurium, and P-type doping elements in the P-type semiconductor layer 123 may be selected from any one or more of magnesium, zinc, calcium, strontium and barium.

Similar to the diode 1A described in the previous embodiments, since both the N-type semiconductor layer 121 and the first substrate 100 have high concentration of N-type doping, and the metal atomic layer 110 is made between the N-type semiconductor layer 121 and the first substrate 100, the diode 1B shown in FIG. 2 may also have a significantly reduced forward conduction voltage drop.

Figure 3:
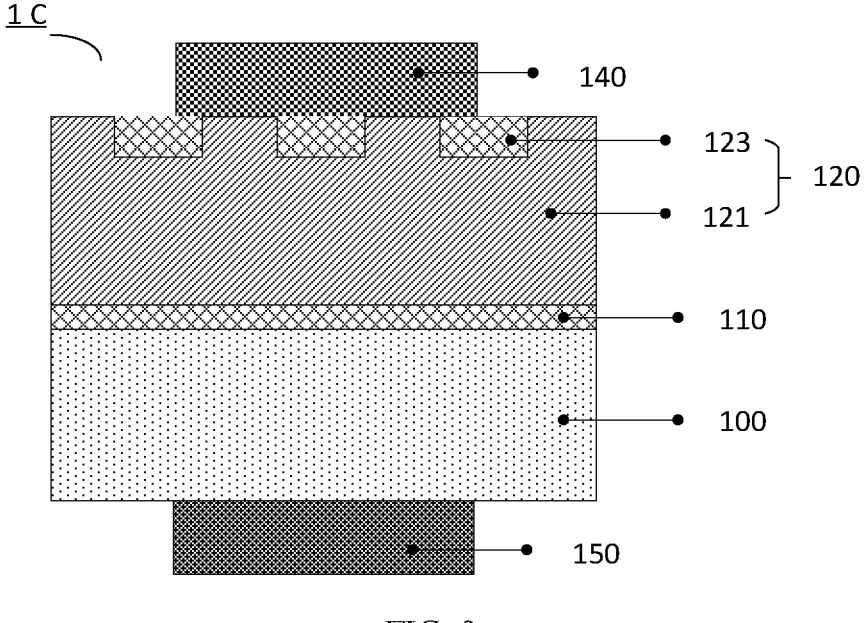
FIG. 3 is a schematic sectional view of a diode according to another embodiment of the present application.

As shown in FIG. 3, a schematic sectional view of diode 1C according to another embodiment of the present application is shown. The difference between the embodiment shown in FIG. 3 and the embodiment shown in FIG. 2 is mainly that the epitaxial structure 120 in the diode 1C shown in FIG. 3 is composed of an N-type semiconductor layer 121 including a groove and a P-type semiconductor layer 123 located in the groove, that is, a JBS structure is formed. Both the N-type semiconductor layer 121 and the P-type semiconductor layer 123 may be a semiconductor layer made of one or more materials selected from GaN, AlN, AlGaN, InGaN, InN, InAlGaN, AlInN, AlGaAs, GaP, GaAs, GaAsP and AlGaInP. N-type doping elements in the N-type semiconductor layer 121 may be selected from any one or more of silicon, germanium, tin, selenium and tellurium, and P-type doping elements in the P-type semiconductor layer 123 may be selected from any one or more of magnesium, zinc, calcium, strontium and barium. The P-type semiconductor layer may be prepared by secondary epitaxy to minimize dislocation density.

Figure 4:
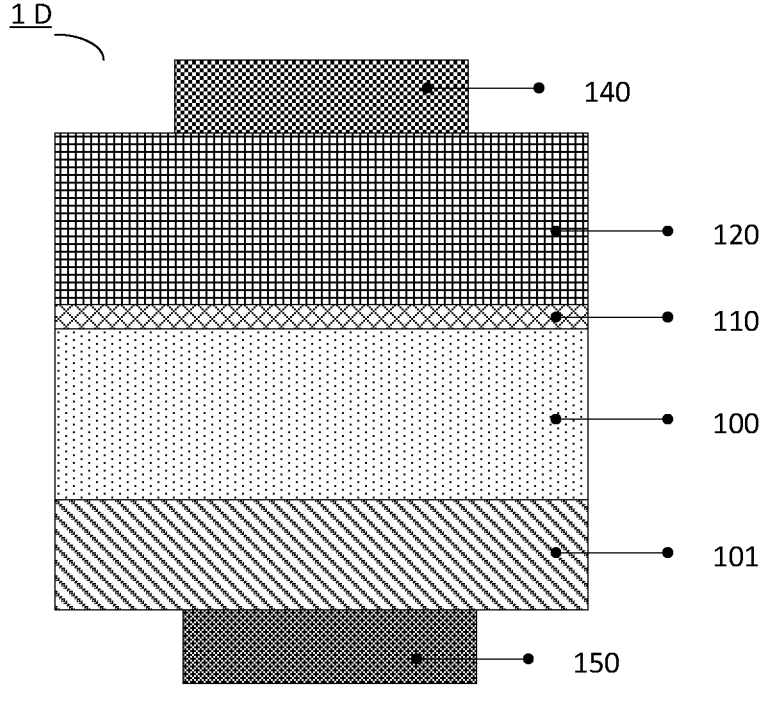
FIG. 4 is a schematic sectional view of a diode according to another embodiment of the present application.

As shown in FIG. 4, a schematic sectional view of a diode 1D according to another embodiment of the present application is shown. The difference between the embodiment shown in FIG. 4 and the embodiment shown in FIG. 1 is mainly that the diode 1D further includes a second substrate 101 located between the first substrate 100 and the second electrode 150. The second substrate 101 is an N-type doped substrate with a doping concentration less than $1 \times 10^{18}$ cm$^{-3}$, the second electrode 150 is in ohmic contact with the second substrate 101. For the rest parts of the diode 1D shown in FIG. 4, reference may be made to the corresponding parts of the diode 1A shown in FIG. 1, and the details are not repeated here.

The second substrate 101 may also be made of GaN, Si, silicon carbide or other suitable non-insulating materials. The first substrate 100 is preferably made of the same material as the second substrate 101, for example, both of them are made of Si. N-type doping elements in the second substrate 101 may be selected from any one or more of silicon, germanium, tin, selenium and tellurium. There is no special limitation on the doping concentration of N-type doping in the second substrate 101, as long as it can meet the requirement of ohmic contact between the second substrate 101 and the second electrode 150. Preferably, the doping concentration of N-type doping in the second substrate 101 is less than that in the first substrate 100, so as to reduce process difficulty. A thickness of the first substrate 100 may be less than, greater than or equal to that of the second substrate 101.

Figure 5:
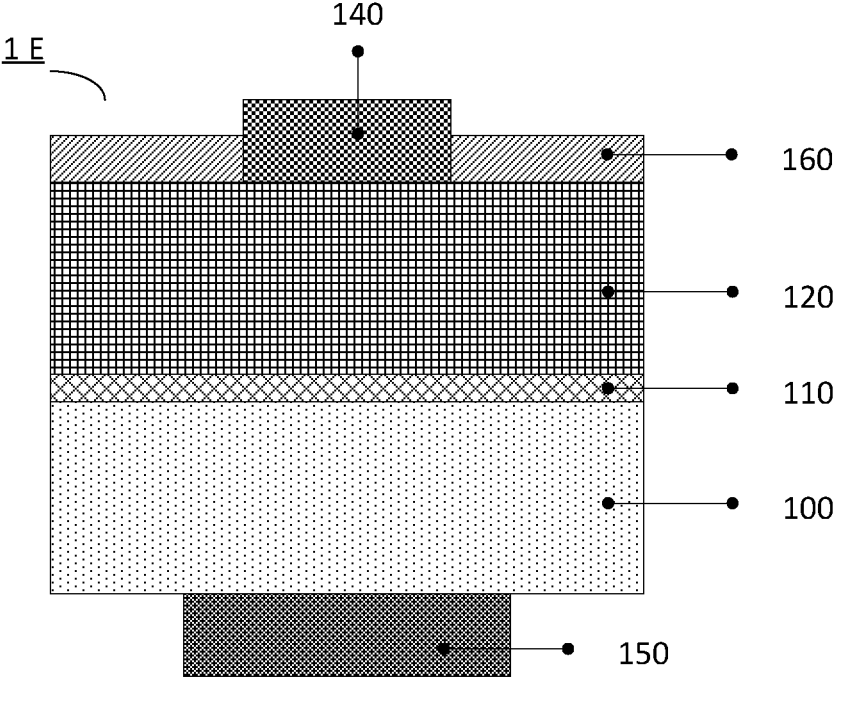
FIG. 5 is a schematic sectional view of a diode according to another embodiment of the present application.

As shown in FIG. 5, a schematic sectional view of a diode 1E according to another embodiment of the present application is shown. The difference between the embodiment shown in FIG. 5 and the embodiment shown in FIG. 1 is mainly that the diode 1E shown in FIG. 5 also includes a passivation layer 160 located on the epitaxial structure 120. The passivation layer 160 may be formed by one or a combination of aluminum nitride, silicon dioxide, silicon oxynitride and aluminum oxide, or may be other suitable medium layers. For the rest parts of the diode 1E shown in FIG. 5, reference may be made to the corresponding parts of the diode 1A shown in FIG. 1, and the details are not repeated here.

The passivation layer 160 in the diode 1E shown in FIG. 5 may effectively suppress effect of dynamic performance degradation caused by defects and surface states in the epitaxial structure 120, thereby reducing impact of the surface states and the defects on device characteristics, and protecting a surface of the epitaxial structure 120 from pollution and damage during a process.

Figure 6:
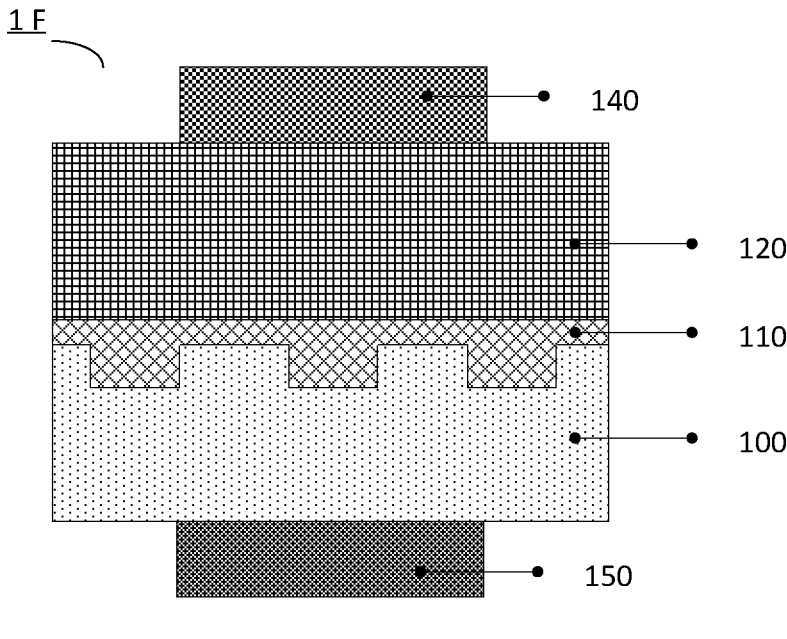
FIG. 6 is a schematic sectional view of a diode according to another embodiment of the present application.

As shown in FIG. 6, a schematic sectional view of a diode 1F according to another embodiment of the present application is shown. The difference between the embodiment shown in FIG. 6 and the embodiment shown in FIG. 1 is mainly that the first substrate 100 in the diode 1F shown in FIG. 6 has a patterned structure, so that the metal atomic layer located on the first substrate 100 also has a patterned structure. In this embodiment, a pattern of the metal atomic layer 110 is a continuous pattern. Compared with the diode 1A shown in FIG. 1, the metal atomic layer 110 with the continuous pattern in this embodiment can increase a contact area with the first substrate 100, thus more effectively reducing the forward conduction voltage drop of the diode.

Figure 7:
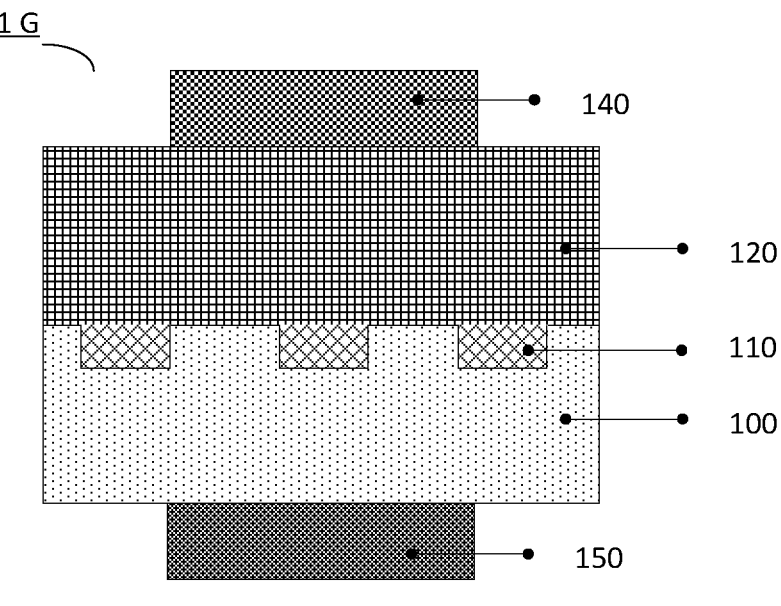
FIG. 7 is a schematic sectional view of a diode according to another embodiment of the present application.

As shown in FIG. 7, a schematic sectional view of a diode 1G according to another embodiment of the present application is shown. The difference between the embodiment shown in FIG. 7 and the embodiment shown in FIG. 6 is mainly that a pattern of the metal atomic layer 110 in the diode 1G shown in FIG. 7 is a discontinuous pattern. Compared with the diode 1A shown in FIG. 1, the metal atomic layer 110 with the discontinuous pattern in this embodiment can effectively reduce the forward conduction voltage drop of the diode, and at the same time, the discontinuous metal atomic layer 110 can make the N-type semiconductor layer 121 have enough nucleation region at an initial stage of growth, and a process of growing the N-type semiconductor layer 121 on the substrate is very mature, which also ensures epitaxial quality of the N-type semiconductor layer 121 in the epitaxial structure 120.

Figure 8:
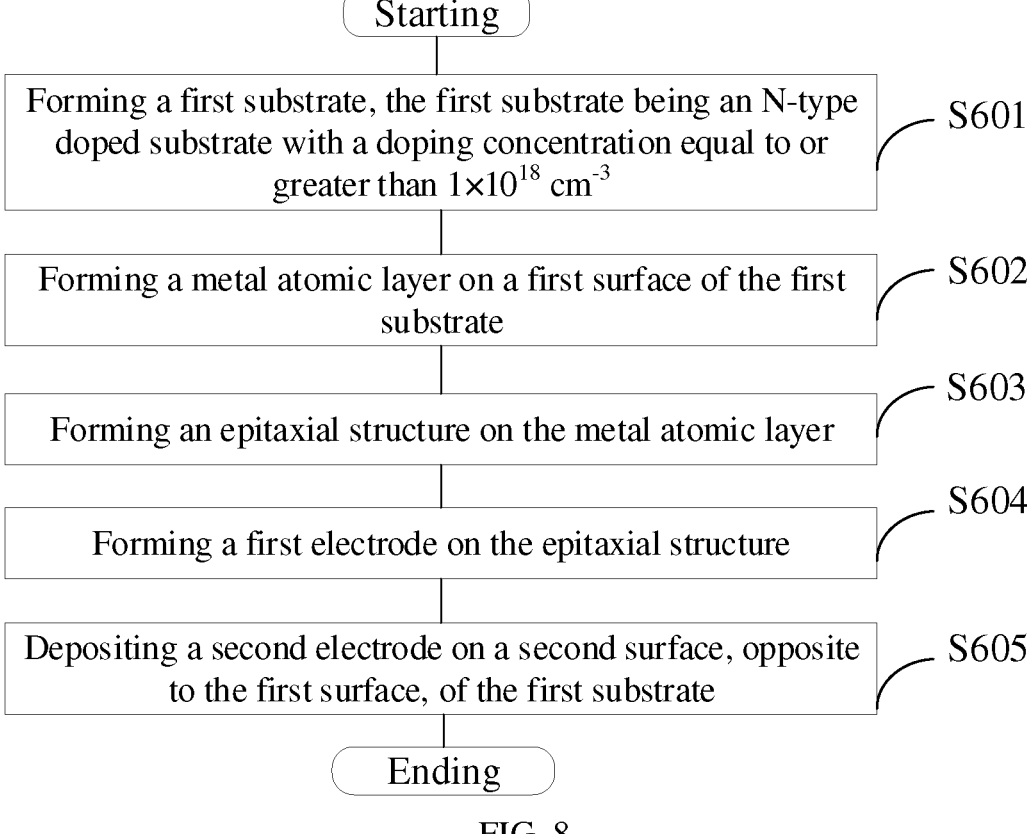
FIG. 8 is a process flow diagram of a manufacturing method of a diode according to an embodiment of the present application.

FIG. 8 shows a process flow diagram of a manufacturing method of a diode according to an embodiment of the present application. The flow diagram may be described in detail with reference to FIG. 9 to FIG. 13. It should be understood that the manufacturing method provided by the embodiments of the present application is not limited to the order described in FIG. 8 and below. It should be understood that in other embodiments, an order of some steps in the method described in the present application may be exchanged according to actual needs, or some steps may also be omitted or deleted.

S601, forming a first substrate, the first substrate being an N-type doped substrate with a doping concentration equal to or greater than $1 \times 10^{18}$ cm$^{-3}$.

Figure 9:
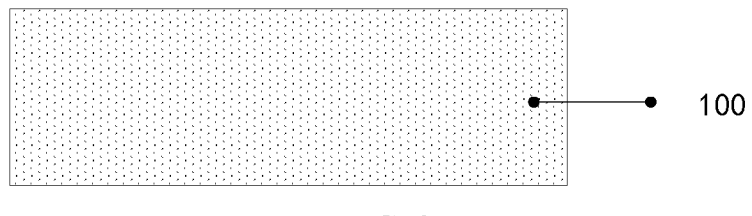
FIG. 9 to FIG. 13 are schematic structural diagrams of each component of a diode prepared respectively in each process flow step of a manufacturing method of the diode according to an embodiment of the present application.

Specifically, as shown in FIG. 9, for example, a Si substrate may be formed, and N-type doping is performed on the Si substrate with the doping concentration of not less than $1 \times 10^{18}$ cm$^{-3}$ to form the first substrate 100.

S602, forming a metal atomic layer on a first surface of the first substrate.

Figure 10:
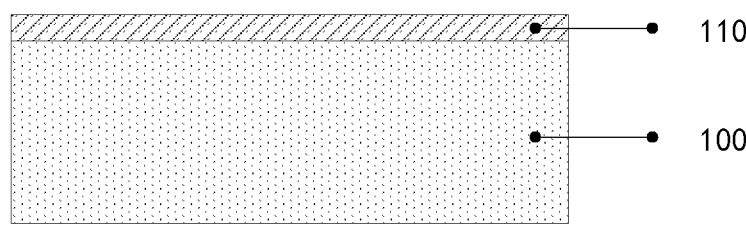

Specifically, as shown in FIG. 10, a material of the metal atomic layer 110 is Al or Mg.

S603, forming an epitaxial structure on the metal atomic layer.

Figure 11:
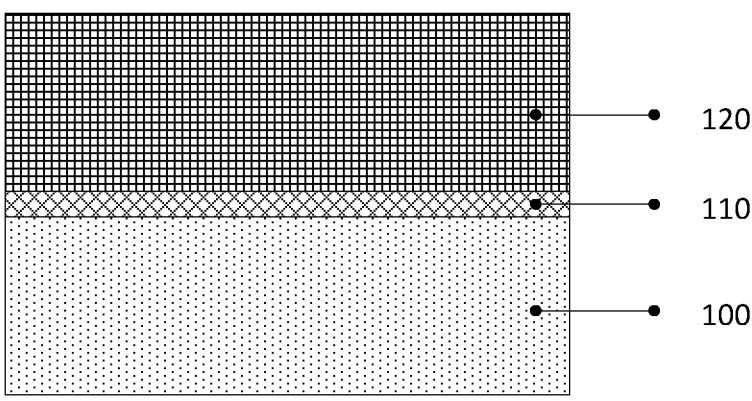

Specifically, as shown in FIG. 11, epitaxial layers included in the epitaxial structure 120 may be produced by a Metal Organic Vapor Phase Epitaxy (MOVPE) method, for example, the epitaxial layers may be the N-type semiconductor layer, the intrinsic semiconductor layer and the P-type semiconductor layer. In-situ production method is not excluded, that is, in a preparation process, different process flows are carried out in a same equipment. In the above process, a take-out action may be performed or not until an end of the in-situ process.

S604, forming a first electrode on the epitaxial structure.

Figures 12, 13:
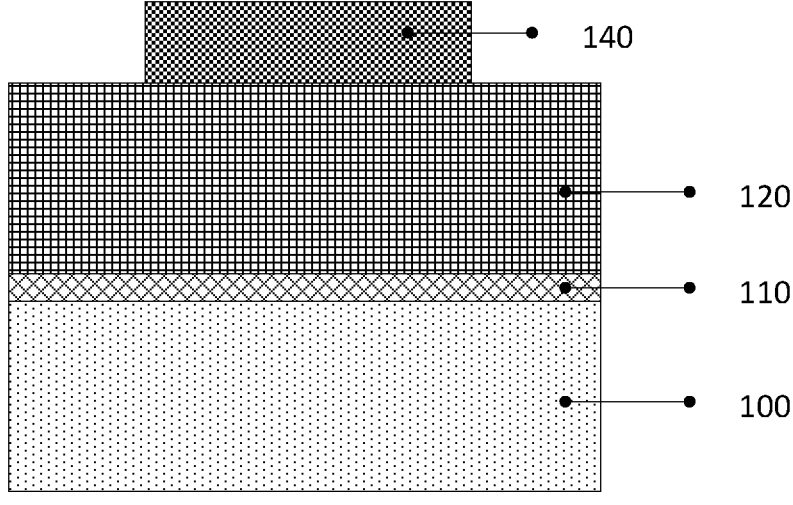

Specifically, as shown in FIG. 12, for example, gold (Au) may be deposited as the first electrode 140 by resistance heating deposition. At the same time, as shown in FIG. 2, when a surface layer, away from the first substrate 100, of the epitaxial structure 120, is a P-type doped semiconductor layer 123, the first electrode 140 is in ohmic contact with the P-type doped semiconductor layer 123. As shown in FIG. 3, when a surface layer, away from the first substrate 100, of the epitaxial structure, includes the N-type semiconductor layer 121 and the P-type semiconductor layer 123, the first electrode 140 is in Schottky and ohmic contact with the epitaxial structure 120.

S605, depositing a second electrode on a second surface, opposite to the first surface, of the first substrate.

Specifically, as shown in FIG. 13, for example, Ti/Al/Ti/Au may be deposited on a surface (i.e., the second surface), away from the metal atomic layer 110, of the first substrate 100, by an Electron Beam Deposition (EBD) method. Then, for example, an intermediate product formed by the deposition may be heated at 600° C. in a nitrogen atmosphere for about 2 minutes to form an alloy, so as to obtain the second electrode 150. The second electrode 150 is in ohmic contact with the first substrate 100.

Further, after the first electrode 140 is deposited, the method may also include: depositing a passivation layer on the epitaxial structure 120.

Further, before the second electrode 150 is deposited on the second surface, opposite to the first surface, of the first substrate 100, the method may also include: forming a second substrate 101 on the second surface, opposite to the first surface, of the first substrate 100, the second substrate 101 is an N-type doped substrate with a doping concentration less than $1 \times 10^{18}$ cm$^{-3}$. Accordingly, the depositing a second electrode 150 on a second surface, opposite to the first surface, of the first substrate 100 may include: depositing the second electrode 150, in ohmic contact with the second substrate 101, on a surface, away from the first substrate 100, of the second substrate 101.

Among them, the definition and description of each component in the method embodiments may be referred to the corresponding parts in the previous device embodiments, which may not be repeated here.

To sum up, a diode and a manufacturing method of the diode are provided by the embodiments of the present application. By performing high concentration N-type doping on the first substrate and making the metal atomic layer, the potential barrier between the epitaxial structure and the first substrate may be reduced, so that the electrons may pass through the potential barrier between the first substrate, the metal atomic layer and the epitaxial structure when the diode is conducted in a forward direction. Therefore, the forward conduction voltage drop of the diode may be significantly reduced. In addition, by setting the metal atomic layer between the substrate and the epitaxial structure, there is no need to perform stripping process after the epitaxial layer is formed, which reduces the damage to the device and omits the preparation steps, effectively saves the preparation cost of the diode and improves the preparation efficiency.

It should also be noted that in the description of the present application, unless otherwise specified and limited, the terms "setting", "installation", "connected" and "connection" should be understood in a broad sense. For example, "connection" may be fixed connection, detachable connection, or integrated connection; "connection" may be mechanical connection or electrical connection; and "connection" may be directly connected, or indirectly connected through an intermediate medium or may be the internal connection of two components. For those of ordinary skill in the art, the specific meaning of the above terms in the present application may be understood according to specific circumstances. In addition, the technical solutions provided in various embodiments of the present application may be used in combination.

In the description of the present application, it should be noted that the orientation or position relationship indicated by the terms "center", "on", "under", "left", "right", "vertical", "horizontal", "inside", "outside", etc. is based on the orientation or position relationship shown in the attached drawings, or is the orientation or position relationship that the product of the present application is usually placed in use. It is only for the convenience of describing the present application and simplifying the description, rather than indicating or implying that the device or element referred to must have a specific orientation, be constructed and operated in a specific orientation, and thus it cannot be understood as a limitation of the present application. In addition, the terms "first", "second", "third" and the like are only used to distinguish descriptions, and cannot be understood as indicating or implying relative importance.

What is claimed is:

1. A diode, comprising:
   a first substrate, the first substrate being an N-type doped substrate with a doping concentration equal to or greater than $1 \times 10^{18}$ cm$^{-3}$;
   a metal atomic layer located on a first surface of the first substrate;
   an epitaxial structure located on the metal atomic layer, wherein the epitaxial structure is in direct contact with the metal atomic layer;
   a first electrode located on the epitaxial structure; and
   a second electrode located on a second surface, opposite to the first surface, of the first substrate.

2. The diode according to claim 1, wherein the epitaxial structure comprises:
   an N-type semiconductor layer; and
   a P-type semiconductor layer located on the N-type semiconductor layer.

3. The diode according to claim 2, wherein the epitaxial structure further comprises: an intrinsic semiconductor layer located between the N-type semiconductor layer and the P-type semiconductor layer.

4. The diode according to claim 2, wherein the N-type semiconductor layer comprises a groove, and the P-type semiconductor layer is located in the groove.

5. The diode according to claim 2, wherein a doping concentration of the N-type semiconductor layer is equal to or greater than $1 \times 10^{18}$ cm$^{-3}$.

6. The diode according to claim 2, wherein the N-type semiconductor layer is a lightly doped semiconductor layer, and the P-type semiconductor layer is a heavily doped semiconductor layer.

7. The diode according to claim 2, wherein the N-type semiconductor layer and the P-type semiconductor layer have a single-layer structure or a multi-layer structure.

8. The diode according to claim 1, wherein the first substrate has at least one pattern.

9. The diode according to claim 1, wherein the metal atomic layer has a pattern, and the pattern is a continuous pattern or a discontinuous pattern.

10. The diode according to claim 1, wherein a material of the metal atomic layer is one of Al and Mg.

11. The diode according to claim 1, wherein a contact manner between the first electrode and the epitaxial structure comprises a Schottky contact.

12. The diode according to claim 1, wherein the second electrode is in ohmic contact with the first substrate.

13. The diode according to claim 1, further comprising: a second substrate located between the first substrate and the second electrode, wherein the second substrate is an N-type doped substrate with a doping concentration less than $1 \times 10^{18}$ cm$^{-3}$, and the second electrode is in ohmic contact with the second substrate.

14. The diode according to claim 2, wherein the N-type semiconductor layer and the P-type semiconductor layer are semiconductor layers made of one or more materials of GaN, AlN, AlGaN, InGaN, InN, InAlGaN and AlInN.

15. The diode according to claim 1, wherein the first electrode and the second electrode are both single-layer metal or multi-layer mixed metal.

16. The diode according to claim 1, further comprising: a passivation layer located on the epitaxial structure, wherein the passivation layer is formed by one or a combination of aluminum nitride, silicon dioxide, silicon oxynitride and aluminum oxide.

17. The diode according to claim 1, wherein the diode is a vertical structure light emitting diode, and a horizontal width of the vertical structure light emitting diode is less than 500 um.

18. The diode according to claim 17, wherein the horizontal width of the vertical structure light emitting diode is less than 100 um.

19. A manufacturing method of a diode, comprising:
forming a metal atomic layer on a first surface of a first substrate, the first substrate being an N-type doped substrate with a doping concentration equal to or greater than $1 \times 10^{18}$ cm$^{-3}$;
forming an epitaxial structure on the metal atomic layer, wherein the epitaxial structure is in direct contact with the metal atomic layer;
forming a first electrode on the epitaxial structure; and
forming a second electrode on a second surface, opposite to the first surface, of the first substrate.

\* \* \* \* \*